(12) United States Patent
Kaneko et al.

(10) Patent No.: US 7,291,278 B2
(45) Date of Patent: Nov. 6, 2007

(54) ELECTRODE FORMING METHOD

(75) Inventors: Tsuyoshi Kaneko, Shimosuwa-machi (JP); Tetsuo Hiramatsu, Chino (JP)

(73) Assignee: Seiko Epson Corporation, Tokyo (JP)

( * ) Notice: Subject to any disclaimer, the term of this patent is extended or adjusted under 35 U.S.C. 154(b) by 430 days.

(21) Appl. No.: 10/934,379

(22) Filed: Sep. 7, 2004

(65) Prior Publication Data

US 2005/0092711 A1    May 5, 2005

(30) Foreign Application Priority Data

Sep. 17, 2003  (JP) .............................. 2003-324450

(51) Int. Cl.
*H01B 13/00*   (2006.01)

(52) U.S. Cl. .................. 216/13; 216/54; 257/E21.172

(58) Field of Classification Search ............... None
See application file for complete search history.

(56) References Cited

U.S. PATENT DOCUMENTS

| | | | | |
|---|---|---|---|---|
| 2,837,619 | A * | 6/1958 | Stein | 338/2 |
| 4,526,810 | A * | 7/1985 | Nesbitt | 216/17 |
| 4,775,611 | A * | 10/1988 | Sullivan | 430/314 |
| 5,325,583 | A * | 7/1994 | Shimizu et al. | 29/849 |
| 5,950,305 | A * | 9/1999 | Roberts | 29/848 |
| 6,264,851 | B1 * | 7/2001 | Markovich et al. | 216/39 |
| 6,900,069 | B2 | 5/2005 | Kaneko et al. | |
| 6,966,997 | B1 * | 11/2005 | Inganas et al. | 216/36 |
| 7,151,209 | B2 * | 12/2006 | Empedocles et al. | 438/689 |
| 2004/0043334 | A1 * | 3/2004 | Kobayashi et al. | 430/315 |
| 2005/0133575 | A1 * | 6/2005 | Gayden et al. | 228/235.2 |

FOREIGN PATENT DOCUMENTS

| | | |
|---|---|---|
| JP | A-54-2941 | 1/1979 |
| JP | A-3-40429 | 2/1991 |
| JP | A-03-248527 | 11/1991 |
| JP | A-5-343795 | 12/1993 |
| JP | A-07-066153 | 3/1995 |
| JP | A 2000-58481 | 2/2000 |
| JP | A-2000-223443 | 8/2000 |
| JP | A-2002-335044 | 11/2002 |

* cited by examiner

*Primary Examiner*—Allan Olsen
(74) *Attorney, Agent, or Firm*—Oliff & Berridge, PLC

(57) ABSTRACT

An electrode forming method with an excellent yield, includes: (a) forming an adhesion preventing member having a predetermined pattern on a base member: (b) forming a conductive layer on the base member and the adhesion preventing member; and (c) forming an electrode having a predetermined pattern by removing the conductive layer on the adhesion preventing member in a state in which the adhesion preventing member is disposed on the base member. Adhesion between the adhesion preventing member and the conductive layer is smaller than adhesion between the base member and the conductive layer.

12 Claims, 13 Drawing Sheets

ELECTRODE FORMING METHOD

RELATED APPLICATIONS

The present application claims priority to Japanese Patent Application No. 2003-324450 filed Sep. 17, 2003, which is hereby expressly incorporated by reference herein in its entirety.

BACKGROUND OF THE INVENTION

1. Field of Invention

Exemplary aspects of the present invention relate to a method of forming electrodes, and more particularly to a method of forming electrodes that are used for electronic devices, such as semiconductor integrated circuit devices, optical devices and the like.

2. Description of Related Art

A lift-off method is used in the related art to form electrodes that are used in electronic devices, such as, for example, semiconductor integrated circuit devices, optical device and the like. For example, a lift-off method is often used in a process of forming electrodes of optical devices that use compound semiconductor. See, Japanese Laid-open Patent Application 2000-58481. A lift-off method is characterized in that minute metal film patterns can be formed by a simple technique, compared to a dry etching method.

A related art lift-off method is described with reference to FIG. 19A through FIG. 19F. First, a photoresist 912 having a predetermined pattern is formed on a substrate to be processed (base member) 10 (see FIG. 19A); an electrode material is then deposited on the base member 10 and the photoresist 912 by vapor deposition or the like to thereby form a conductive layer 20a (see FIG. 19B). Then the photoresist 912 is dissolved in a liquid 25, such as a stripping liquid, acetone or the like (see FIG. 19C). By this, the photoresist 912 is removed from the base member 10 (see FIG. 19D or FIG. 19E). In this instance, there may be cases when a conductive layer 20x formed on the photoresist 912 may adhere to the base member 10. Accordingly, as indicated in FIG. 19D or FIG. 19E, the conductive layer 20x formed on the photoresist 912 is removed to obtain a conductive layer 20 having a predetermined pattern (see FIG. 19F). The conductive layer 20 has an opening section 22 at a location where the photoresist 912 was provided, as shown in FIG. 19F).

Methods to remove the conductive layer 20x include, for example, a method to blow off the conductive layer 20x by jetting liquid or gas 13 under a high pressure against the conductive layer 20x (see FIG. 19D), and a method to remove the conductive layer 20x from the base member 10 by adhering an adhesive tape 14 to the conductive layer 20x and peeling the adhesive tape 14 (see FIG. 19E).

SUMMARY OF THE INVENTION

However, in the above-described lift-off methods, the conductive layer 20x may adhere to the base member 10 after the photoresist 912 is removed (see FIG. 19C). In this case, it becomes difficult to remove the conductive layer 20x from the base member 10, and the yield may be lowered.

Also, a bottom surface 22a in the opening section 22 formed by the lift-off method may have a certain function. For example, when the base member 10 is an optical device, the bottom surface 22a in the opening section 22 may function as a light incidence surface or a light emission surface. In this case, if the bottom surface 22a in the opening section 22 is deteriorated, or a portion of the conductive layer 20x that could not be removed (residue 20y) may stick to the side surface of the opening section 22 (see FIG. 19F), the characteristic of the optical device may deteriorate.

Exemplary aspects of the invention provide a method of forming electrodes with a high yield.

(1) An electrode forming method in accordance with an exemplary aspect of the invention includes: (a) forming an adhesion preventing member having a predetermined pattern on a base member; (b) forming a conductive layer on the base member and the adhesion preventing member; and (c) forming an electrode having a predetermined pattern by removing the conductive layer on the adhesion preventing member in a state in which the adhesion preventing member is disposed on the base member, adhesion between the adhesion preventing member and the conductive layer being smaller than adhesion between the base member and the conductive layer.

It is noted that, in exemplary aspects of the invention, "base member" refers to a member that has an upper surface on which a conductive layer having a predetermined pattern is formed. The "base member" is not particularly limited as long as it has a surface where a conductive layer having a predetermined pattern can be formed. The "base member" may not only be a so-called semiconductor substrate, such as a silicon substrate and a compound semiconductor substrate, but also, for example, a substrate for mounting, such as a glass substrate, an epoxy substrate, a glass epoxy substrate, or an optical device, such as a surface-emitting type semiconductor laser, a photodiode, an electro-luminescence device and the like. Moreover, semiconductor elements, such as transistors and diodes may be provided on the above-described semiconductor substrate, and the optical device may be provided with an emission surface or an incidence surface.

Also, in an exemplary aspect of the invention, when two members are bonded at certain surfaces thereof, the "adhesion" refers to a property indicating the bonding strength between the two members against a force externally applied thereto. The greater the adhesion, the more difficult it is to separate the two members from each other, and the smaller the adhesion, the easier it is to separate the two members from each other.

Furthermore, in an exemplary aspect of the invention, the "adhesion preventing member" refers to a member for providing a region where the conductive layer is not directly formed on the base member.

According to the electrode forming method of an exemplary aspect of the invention, the adhesion between the adhesion preventing member and the conductive layer is smaller than the adhesion between the base member and the conductive layer, such that only the conductive layer on the adhesion preventing member can be selectively and readily removed. By this, the conductive layer on the adhesion preventing member can be removed without inflicting damage to the surface of the base member. As a result, the yield can be enhanced.

The electrode forming method described above can further include (d) removing the adhesion preventing member after (c). In this case, in (d), the adhesion preventing member can be removed by using an etchant having an etching rate to the base member greater than an etching rate to the adhesion preventing member.

(2) An electrode forming method in accordance with an exemplary aspect of the invention includes: (a) forming an adhesion preventing member having a predetermined pattern on a base member; (b) forming a conductive layer on the base member and the adhesion preventing member; (c) degenerating at least a surface of the adhesion preventing member to thereby lower adhesion thereof with the conductive layer; and (d) forming an electrode having a predetermined pattern by removing the conductive layer on the adhesion preventing member in a state in which the adhesion preventing member having at least the surface thereof degenerated is disposed on the base member.

According to the electrode forming method of an exemplary aspect of the invention, by removing the conductive layer on the adhesion preventing member in a state in which the adhesion preventing member having at least the surface thereof degenerated is disposed on the base member, only the conductive layer on the adhesion preventing member can be selectively and readily removed. By this, the conductive layer on the adhesion preventing member can be removed without inflicting damages to the surface of the base member. As a result, the yield can be enhanced.

It is noted that, in the electrode forming method described above, (c) may be conducted after (b), or (b) may be conducted after (c).

Here, in the electrode forming method described above, in (c), at least the surface of the adhesion preventing member can be degenerated by conducting a plasma processing on the surface of the adhesion preventing member.

Also, in the electrode forming method described above, in (c), the adhesion preventing member can be degenerated by soaking the adhesion preventing member with a liquid. In this case, in (c), degeneration of the adhesion preventing member can be caused by swelling of the adhesion preventing member by the liquid. Also, in this case, in the electrode forming method described above, the adhesion preventing member can include photoresist.

Also, the electrode forming method described above can include (e) removing the adhesion preventing member after (d). In this case, the adhesion preventing member can be removed by using an etchant having an etching rate to the base member greater than an etching rate to the adhesion preventing member.

Moreover, in the electrode forming methods described above in (1) and (2), the adhesion preventing member can include insulation material. In this case, the insulation material can include at least one material selected from silicon oxides and silicon nitrides.

Also, in the electrode forming methods described above in (1) and (2), the insulation material can include resin. In this case, the resin can include at least one resin selected from polyimide resin, fluororesin, acrylic resin, and epoxy resin.

Moreover, in the electrode forming methods described above in (1) and (2), the electrode can be an electrode of an optical device. In this case, the optical device can be one of a surface-emitting type semiconductor laser, a photodiode and a semiconductor light-emitting diode.

DETAILED DESCRIPTION OF EXEMPLARY EMBODIMENTS

Exemplary embodiments of the invention are described below with reference to the accompanying drawings.

First Exemplary Embodiment

1. Electrode Forming Method

FIG. 1A through FIG. 1F are schematics showing an electrode forming method in accordance with an exemplary embodiment of the invention.

The electrode forming method in accordance with the present exemplary embodiment can be applied to form electrodes and metal wiring layers that are used for electronic devices, such as semiconductor integrated circuit devices and optical devices.

Figure 1A:
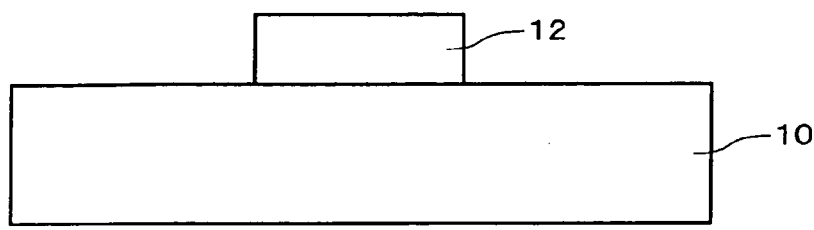
FIG. 1A through FIG. 1F are schematics showing an electrode forming method in accordance with a first exemplary embodiment of the invention.

First, an adhesion preventing member 12 is provided on a base member 10 (see FIG. 1A). The adhesion preventing member 12 is provided in a region where an opening section 22 is formed (see FIG. 1F). In other words, the adhesion preventing member 12 is formed in the region where an electrode 20 (see FIG. 1F) is not provided on the base member 10. Specifically, the electrode 20 in a predetermined pattern having the opening section 22 is obtained by removing the adhesion preventing member 12 from the base member 10 in as described below (see FIG. 1F).

The adhesion preventing member 12 is formed from a member having an adhesion to a conductive layer 20a, to be described below, lower than an adhesion to the base member 10. The conductive layer 20a can be separated from the adhesion preventing member 12 with a force smaller than a force required to separate the conductive layer 20a from the base member 10.

The adhesion preventing member 12 can be composed of insulating material, for example. In this case, the insulating material can be composed of at least one material selected from silicon oxides and silicon nitrides. Also, the adhesion preventing member 12 can be composed of resin. In this case, the resin can be composed of at least one resin selected from polyimide resin, fluororesin, acrylic resin, and epoxy resin.

Figure 1B:
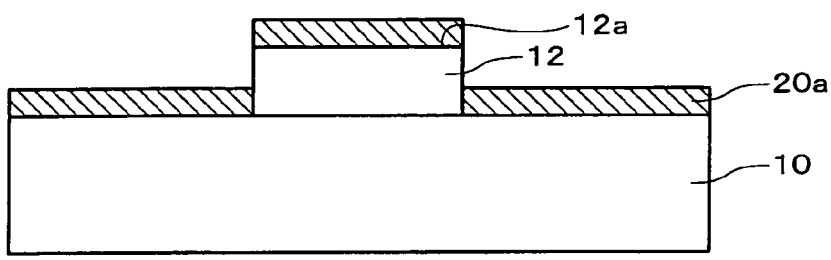

Next, a conductive layer 20a is formed on the base member 10 and the adhesion preventing member 12 (see FIG. 1B). As the conductive layer 20a, although it is not particularly limited, for example, gold, silver, platinum, copper, aluminum, germanium, zinc, cobalt, nickel, palladium, titanium, molybdenum, alloy of these metals, or conductive resin can be used. As the conductive resin, resin in which particles (for example, particles of the above-mentioned metal or alloy) are dispersed and resin including electroconductive polymer can be used. Also, a method of forming the conductive layer 20a is not particularly limited, but can be appropriately selected according to the material. For example, the conductive layer 20a can be formed by, for example, a vapor deposition method, a sputtering method, a CVD method, or the like.

Figure 1C:
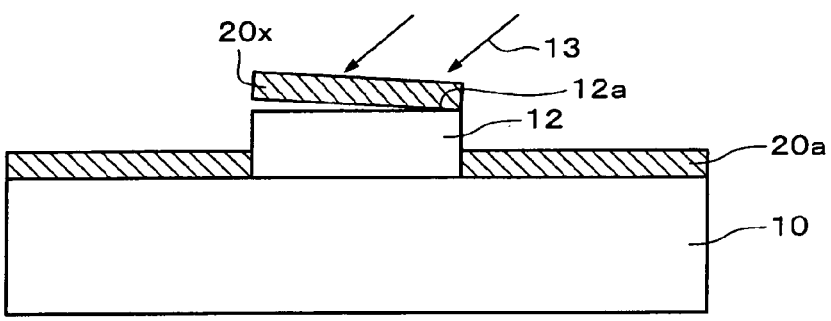
Figure 1D:
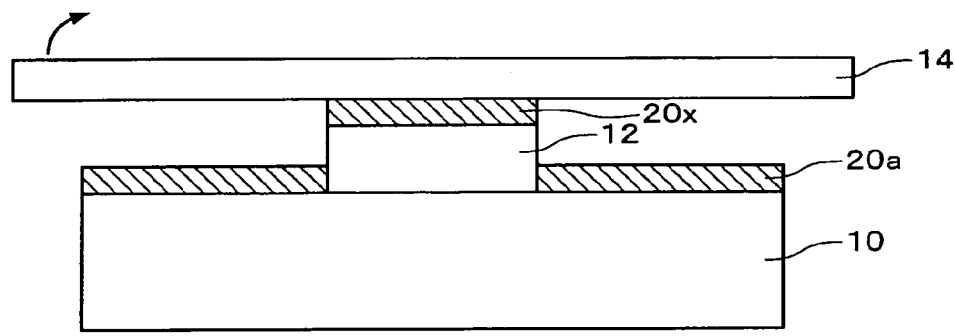
Figure 1E:
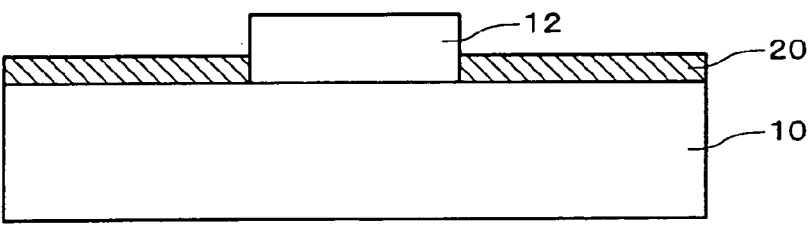

Next, a portion of the conductive layer 20a (conductive layer 20x) on the adhesion preventing member 12 is removed in a state in which the adhesion preventing member 12 is disposed on the base member 10 (see FIG. 1C-FIG. 1E). As a result, an electrode 20 having a predetermined pattern can be obtained (see FIG. 1E). As a method to remove the conductive layer 20x, for example, one or both of the methods indicated in FIG. 1C and FIG. 1D can be used. FIG. 1C shows a method to blow off the conductive layer 20x from the upper surface 12a of the adhesion preventing member 12 by discharging liquid or gas under high pressure against the conductive layer 20x. The discharging pressure of the liquid or gas 13 may be appropriately adjusted according to the material and film thickness of the conductive layer 20x, and the adhesion strength between the conductive layer 20x and the adhesion preventing member 12.

Moreover, as the liquid or gas 13, liquid or gas which may cause as little damage as possible to the adhesion preventing member 12, the conductive layer 20 and the base member 10 upon discharging the liquid or gas 13 under a high pressure against the conductive layer 20x may be selected. FIG. 1D shows a method to remove the conductive layer 20x by adhering an adhesive sheet 14 to the conductive layer 20x and then peeling the adhesive sheet 14.

Figure 1F:
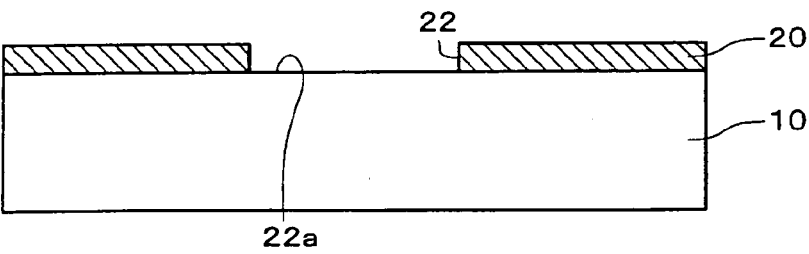

Then, the adhesion preventing member 12 is selectively removed depending on the requirements (see FIG. 1F). It is noted here that the adhesion preventing member 12 may be selectively removed by using a difference in etching rate between the base member 10 and the adhesion preventing member 12. Specifically, the adhesion preventing member 12 is removed by using an etchant that causes an etching rate to the adhesion preventing member 12 that is greater than an etching rate to the base member 10. By this, the adhesion preventing member 12 can be removed without inflicting damages to the base member 10. Furthermore, to remove the adhesion preventing member 12, an appropriate method can be selected depending on the material, film thickness, etc. of the adhesion preventing member 12. For example, a dry etching method and a wet etching method can be used. It is noted that, when the adhesion preventing member 12 is used for other purposes (see the second exemplary embodiment to be described below, for example), the adhesion preventing member 12 may not have to be removed. By the steps described above, the electrode 20 having the opening section 22 can be obtained (see FIG. 1F).

2. Functions and Effect

According to the electrode forming method of the present exemplary embodiment, the adhesion between the adhesion preventing member 12 and the conductive layer 20a is smaller than the adhesion between the base member 10 and the conductive layer 20a, such that only the conductive layer 20a on the adhesion preventing member 12 (conductive layer 20x) can be selectively and readily removed. By this, the conductive layer 20x can be removed without causing damages to the surface of the base member 10. As a result, the yield can be enhanced.

Also, according to the electrode forming method of the present exemplary embodiment, the conductive layer 20x is removed in the state in which the adhesion preventing member 12 is disposed on the base member 10 (see FIG. 1C or FIG. 1D, and then the adhesion preventing member 12 is removed. By this, portions of the conductive layer 20x removed are prevented from adhering to the opening section 22 (see FIG. 1F). Furthermore, when the liquid or gas 13 is used to remove the conductive layer 20x on the adhesion preventing member 12 (see FIG. 1C), the bottom surface 22a in the opening section 22 can be prevented from being exposed to the liquid or gas 13 because the adhesion preventing member 12 is formed on the base member 10. As a result, damages to the bottom surface 22a in the opening section 22 can be reduced or prevented from occurring.

Second Exemplary Embodiment

1. Electrode Forming Method

FIG. 2A through FIG. 2E are schematics showing an electrode forming method in accordance with an exemplary embodiment of the invention.

The electrode forming method in accordance with the present exemplary embodiment can be applied to form electrodes and metal wiring layers that are used for electronic devices, such as semiconductor integrated circuit devices and optical devices, like the electrode forming method in accordance with the first exemplary embodiment.

First, an adhesion preventing member 32 is provided on a base member 10. Then a conductive layer 20*a* is provided on the base member 10 and the adhesion preventing member 32 (see FIG. 1A and FIG. 1B). Up to this point, the same steps as the electrode forming method in the first exemplary embodiment are conducted. The material of the adhesion preventing member 32 is described below.

Figure 2A:
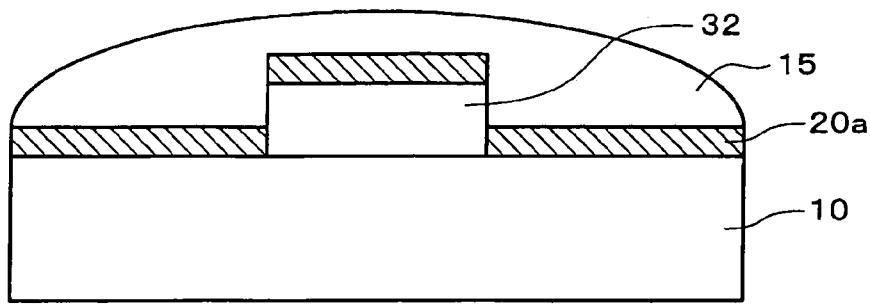
FIG. 2A through FIG. 2E are schematics showing steps of the electrode forming method in accordance with the first embodiment of the invention.

At least a surface of the adhesion preventing member 32 is degenerated, to deteriorate its adhesion with the conductive layer 20*a* (see FIG. 2A). By this, the adhesion between the adhesion preventing member 32 (adhesion preventing member 32*x*) after degeneration and the conductive layer 20*a* can be made smaller than the adhesion between the base member 10 and the conductive layer 20*a*. The present embodiment is described as to the case where the adhesion preventing member 32*x* is formed by degeneration of the adhesion preventing member 32 by soaking the adhesion preventing member 32 with a liquid (see FIG. 2B). However, the adhesion preventing member 32 can be degenerated by another method. For example, although not shown, the surface of the adhesion preventing member 32 may be subjected to a plasma treatment, to thereby degenerate at least the surface of the adhesion preventing member 32. In this case, as the plasma treatment, a surface treatment with plasma including radical oxygen or fluorine can be used. In this case, the adhesion preventing member 32 can be composed of a material enumerated as the adhesion preventing member 12 in the first exemplary embodiment.

As shown in FIG. 2A, when the adhesion preventing member 32 is soaked with a liquid 15, the adhesion preventing member 32 can be swelled by the liquid 15 to cause degeneration of the adhesion preventing member 32 such that the adhesion preventing member 32*x* can be obtained. By swelling the adhesion preventing member 32 with the liquid 15 to cause its degeneration, the adhesion preventing member 32 can be degenerated while the configuration of the adhesion preventing member 32 can be maintained. Accordingly, an electrode 20 can be formed into a desired pattern.

For example, a liquid with a low solubility to the adhesion preventing member 32 is desirable as the liquid 15 when the adhesion preventing member 32 is composed of photoresist. The liquid, that can be used as the liquid 15, is different depending on the kind, etc. of the photoresist used, and can be, for example, in general, ethanol, methanol, isopropyl alcohol, n-propyl alcohol, n-butanol, a mixed solution of these liquid, or a solution of any one of them diluted with water, etc., when the photoresist is the one that contains novolac resin, These liquid can also be used for other types of photoresist.

Figure 2B:
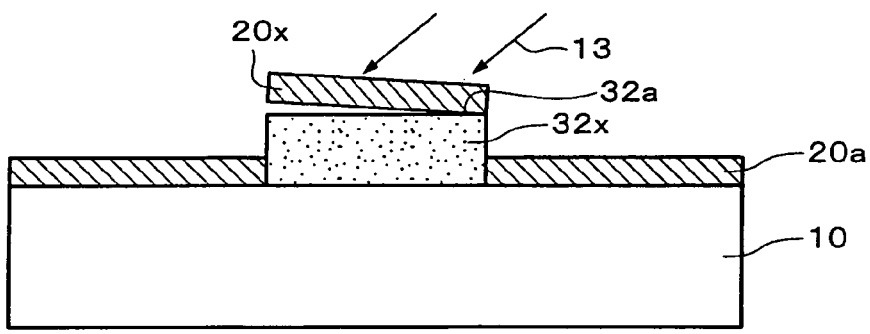
Figure 2C:
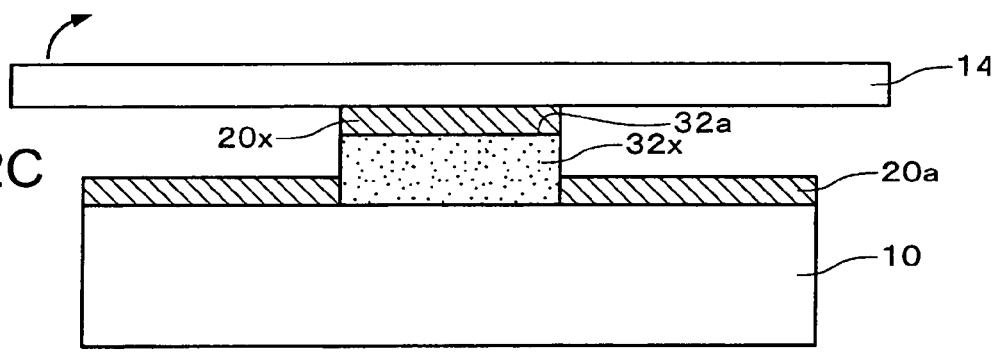
Figure 2D:
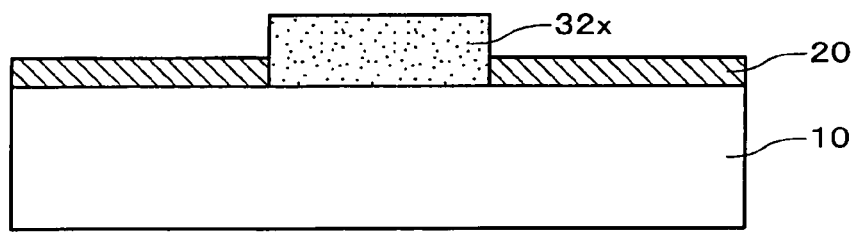

Then, the conductive layer 20*a* (conductive layer 20*x*) on the adhesion preventing member 32*x* is removed in the state in which the adhesion preventing member 32*x* is disposed on the base member 10 (see FIG. 2B-FIG. 2D). The conductive layer 20*x* can be removed by a method similar to the method indicated in conjunction with the first exemplary embodiment (for example, discharge of a liquid or gas 13 under a high pressure, or adhesion and peeling of an adhesive tape 14) (see FIG. 2B and FIG. 2C).

Figure 2E:
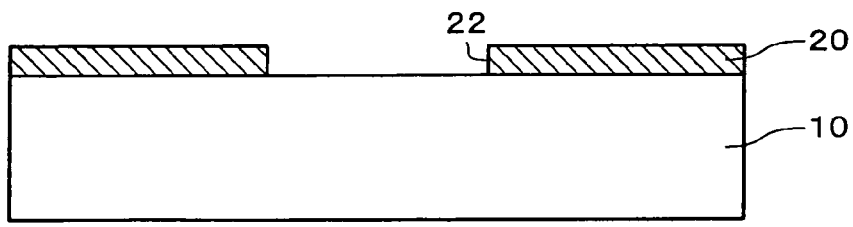

Next, the adhesion preventing member 32*x* is removed depending on the requirements (see FIG. 2E). By this, an electrode 20 in a predetermined pattern having an opening section 22 is formed. It is noted that the adhesion preventing member 32*x* can be removed by a method that is appropriately selected depending on the material of the adhesion preventing member 32*x*.

In the process described above, the case where the adhesion preventing member 32 is degenerated after the conductive layer 20*x* is formed on the adhesion preventing member 32 and the adhesion preventing member 32*x* is obtained is indicated (see FIG. 2A and FIG. 2B). Alternatively, after the adhesion preventing member 32 is degenerated to obtain the adhesion preventing member 32*x*, the conductive layer 20*x* may be formed on the adhesion preventing member 32*x*.

2. Functions and Effect

According to the electrode forming method of the present exemplary embodiment, the conductive layer 20*a* (conductive layer 20*x*) on the adhesion preventing member 32*x* is removed in the state in which the adhesion preventing member 32*x* having at least the surface thereof degenerated is disposed on the base member 10. By this, only the conductive layer 20*a* on the adhesion preventing member 32*x* can be selectively and readily removed. Accordingly, the conductive layer 20*x* can be removed without causing damages to the surface of the base member 10. As a result, the yield can be enhanced.

Also, according to the electrode forming method of the present exemplary embodiment, the conductive layer 20*x* is removed in the state in which the adhesion preventing member 32*x* is disposed on the base member 10 (see FIG. 2B or FIG. 2C), and then the adhesion preventing member 32*x* is removed (see FIG. 2D and FIG. 2E), like in the electrode forming method of the first exemplary embodiment. Accordingly, portions of the conductive layer 20*x* removed are prevented from adhering to the opening section 22 (see FIG. 2(*e*)).

Furthermore, when the liquid or gas 13 is used to remove the conductive layer 20*x* on the adhesion preventing member 32*x* (see FIG. 2B), the bottom surface 22*a* in the opening section 22 can be prevented from being exposed to the liquid or gas 13 upon removal of the conductive layer 20*x* because the adhesion preventing member 32 is formed on the base member 10. As a result, damages to the bottom surface 22*a* in the opening section 22 can be reduced or prevented from occurring.

EXEMPLARY EMBODIMENTS

The invention is further described in detail based on exemplary embodiments. However, the invention is not limited to these exemplary embodiments. In the exemplary embodiments described below, examples in which an electrode manufacturing method of an exemplary aspect of the invention is applied to forming electrodes of an optical device are described. However, the application of the invention is not limited to optical devices. Also, in the exemplary embodiments described below, the case where the optical device is a surface-emitting type semiconductor laser is described. However, the optical device to which the invention can be applied is not limited to this particular example and the invention can similarly be applied to other optical devices. For example, a photodiode and a semiconductor light emitting diode. In this case, the functions and effect of exemplary aspects of the invention can also be demonstrated. The material and film thickness of each layer that composes a surface-emitting type semiconductor laser, illustrated as an example by the following exemplary embodiment, are presented for illustration purposes, and the invention is not limited to these examples.

Exemplary Embodiment 1

Figure 3:
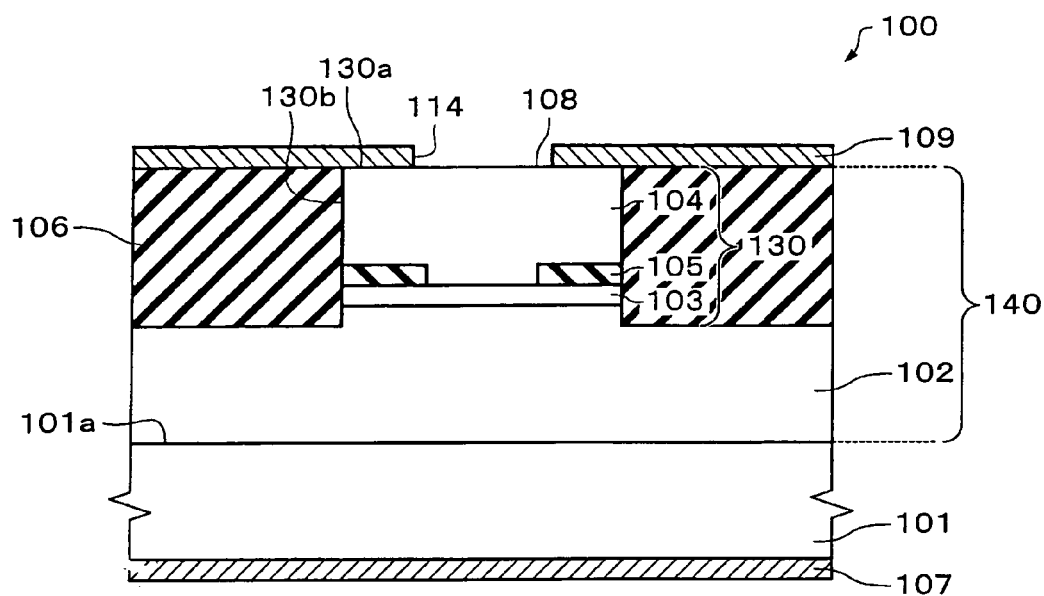
FIG. 3 is a schematic of a surface-emitting type semiconductor laser having an electrode obtained by using the electrode forming method in accordance with the first exemplary embodiment of the invention.
Figure 4:
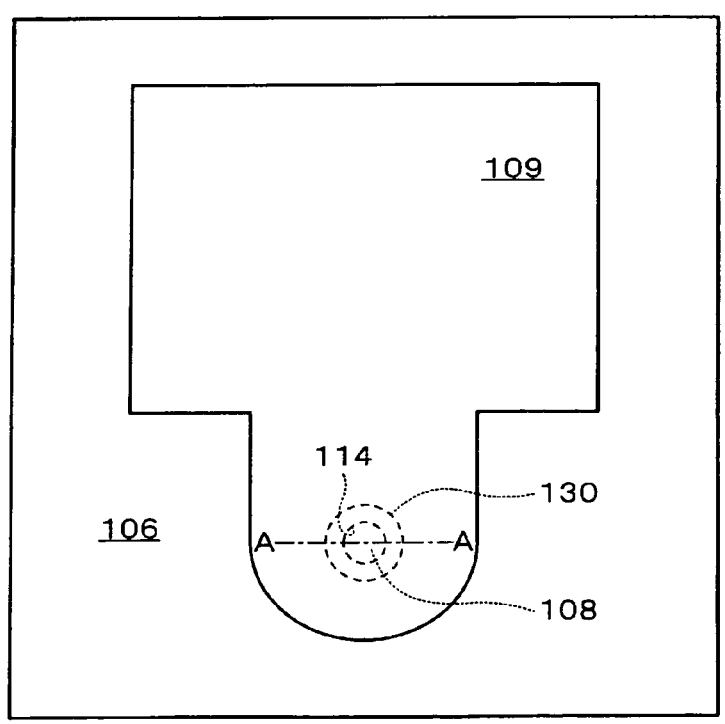
FIG. 4 is a schematic of the surface-emitting type semiconductor laser shown in FIG. 3.
Figure 5:
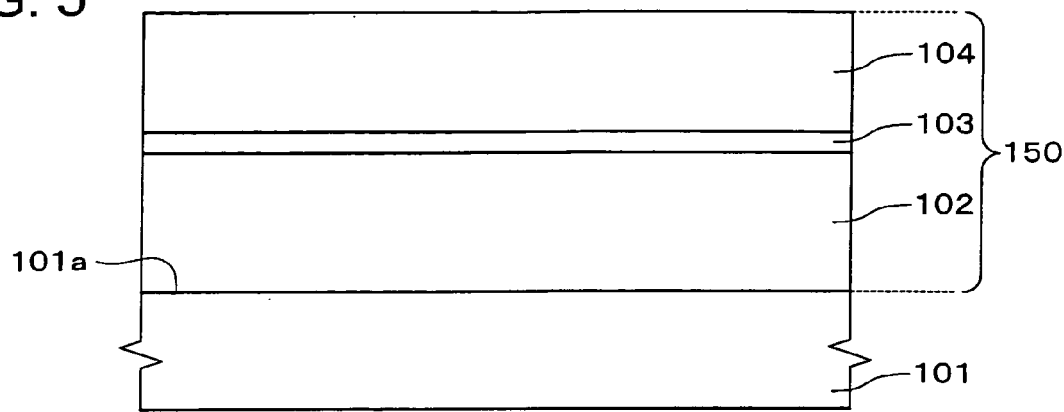
FIG. 5 is a schematic showing a step for manufacturing the surface-emitting type semiconductor laser shown in FIG. 3 and FIG. 4.

FIG. 3 is a schematic of a surface-emitting type semiconductor laser (hereafter "surface-emitting laser") 100 having an electrode (second electrode) 109 that is formed by using an electrode forming method of an exemplary aspect of the invention. Specifically, the surface-emitting laser 100 of the present exemplary embodiment is formed through the application of the electrode forming method of the second exemplary embodiment described above. FIG. 4 is a schematic of the surface-emitting laser 100 shown in FIG. 3. FIG. 3 is a cross-sectional view taken along a plane A-A in FIG. 4.

Structure of Surface-Emitting Laser

As shown in FIGS. 1A-F, the surface-emitting laser 100 of the present exemplary embodiment includes a vertical resonator (hereinafter "resonator") 140. A semiconductor deposited body (hereinafter "columnar section") 130 in the shape of a pillar is provided in the resonator 140. The surface-emitting laser 100 includes an active layer 103 that generates laser light, which is emitted from an emission surface 108. The emission surface 108 is provided on an upper surface 130a of the columnar section 130. Specifically, a bottom surface in an opening section 114 provided in the second electrode 109 defines the emission surface 108.

The resonator 140 is formed from a distributed reflection type multilayer mirror of 40 pairs of alternately laminated n-type $Al_{0.9}Ga_{0.1}As$ layer and n-type $Al_{0.15}Ga_{0.85}As$ layer (hereafter "first mirror") 102, an active layer 103 composed of GaAs well layers and $Al_{0.3}Ga_{0.7}As$ barrier layers in which the well layers include a quantum well structure composed of three layers, and a distributed reflection type multilayer mirror of 25 pairs of alternately laminated p-type $Al_{0.9}Ga_{0.1}As$ layer and p-type $Al_{0.15}Ga_{0.85}As$ layer (hereafter "second mirror") 104, which are successively stacked in layers.

A portion among the resonator 140 extending from the second mirror 104 to an intermediate point of the first mirror 102 of the surface-emitting laser 100 is etched in a circular shape, as viewed in a direction perpendicular to the emission surface 108, to form the columnar section 130. Also, a side wall 130 of the columnar section 130 is embedded with an insulation layer 106 that is composed of polyimide resin.

The second mirror 104 is made to be p-type by C-doping, and the second mirror 102 is made to be n-type by Si-doping. Accordingly, a pin diode is formed by the p-type second mirror 104, the active layer 103 that is not doped with an impurity, and the n-type first mirror 102.

Also, a current constricting layer 105, which is composed of aluminum oxide, is formed in a region near the active layer 103 among the second mirror 104. The current constricting layer 105 is formed in a ring shape. The current constricting layer 105 has cross sections that are concentric, when cut in a plane parallel with the surface 101a of the semiconductor substrate 101 shown in FIG. 1.

Further, the resonator 140 is provided with a first electrode 107 and a second electrode 109. The first electrode 107 and the second electrode 109 are used to apply a voltage across the resonator 140 to drive the same. The second electrode 109 is provided on the upper surface 130a of the columnar section 130. Specifically, as shown in FIG. 3 and FIG. 4, the second electrode 109 has a plane configuration in a ring shape in the upper surface 130a of the columnar section 130. The second electrode 109 is provided in a manner to encircle the columnar section 130.

The first electrode 107 is formed from a multilayer film of Au and an alloy of Au and Ge. Also, the second electrode 109 is formed from a multilayer film of Pt, Ti, and Au. An electric current is injected into the active layer 103 by the first electrode 107 and the second electrode 109.

Method of Manufacturing Surface-Emitting Laser

Next, the surface-emitting laser 100 of the present exemplary embodiment is manufactured by the following method. The method for manufacturing the surface-emitting laser 100 in accordance with the present exemplary embodiment is described with reference to FIG. 3 through FIG. 13. FIG. 5 through FIG. 13 are schematics showing a process to manufacture the surface-emitting laser 100 shown in FIG. 3 and FIG. 4, each of which corresponds to the cross-sectional view indicated in FIG. 3.

(1) Process Before Forming Electrodes

First, on a surface 101a of a semiconductor substrate 101 composed of n-type GaAs, a semiconductor multilayer film 150 (see FIG. 5) is formed by epitaxial growth while modifying its composition. It is noted here that the semiconductor multilayer film 150 is formed from a first mirror 102, an active layer 103, and a second mirror 104. Each of the layers may have the film thickness and composition described above.

When growing the second mirror 104, at least one layer thereof adjacent to the active layer 103 is formed as an AlAs layer (or an AlGaAs layer with its Al composition being 0.95 or greater). This layer is later oxidized and becomes a current constricting layer 105 (see FIG. 7). Also, in the present exemplary embodiment, each of the layers is epitaxially grown by a MOCVD method.

Figure 6:
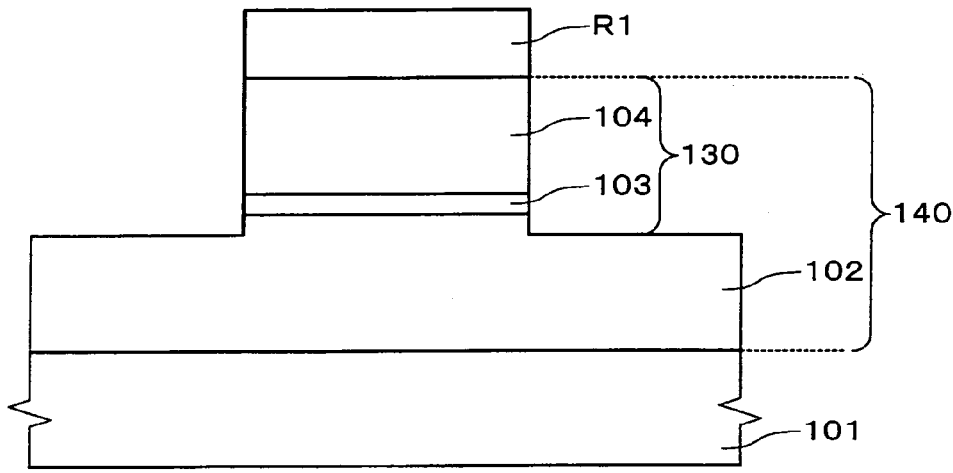
FIG. 6 is a schematic showing a step for manufacturing the surface-emitting type semiconductor laser shown in FIG. 3 and FIG. 4.

Then, a resonator 140 that includes a columnar section 130 (see FIG. 6) is formed by patterning. Specifically, first, photoresist (not shown in the figure) is coated on the second mirror 104. Then the photoresist is patterned by a photolithography method, thereby forming a resist layer R1 having a predetermined pattern, (see FIG. 6). Next, by using the resist layer R1 as a mask, the second mirror 104, the active layer 103 and a part of the first mirror 102 are etched by, for example, a dry etching method. By this, the columnar section 130 is formed, as shown in FIG. 6. By the steps described above, the resonator 140 including the columnar section 130 is formed. Then, the resist layer R1 is removed.

Figure 7:
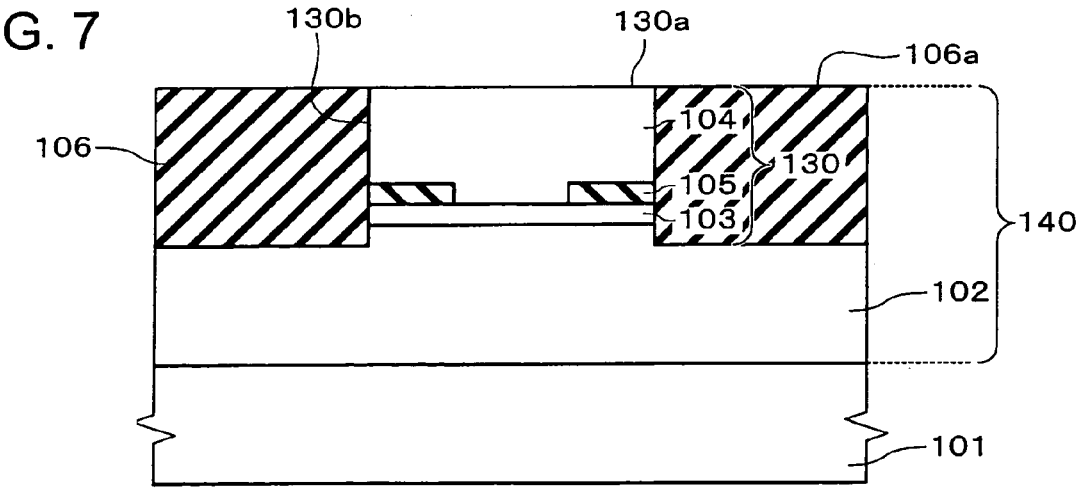
FIG. 7 is a schematic showing a step for manufacturing the surface-emitting type semiconductor laser shown in FIG. 3 and FIG. 4.

Next, by placing the semiconductor substrate 101, on which the resonator 140 is formed through the aforementioned process, in a water vapor atmosphere at about 400° C., for example, the layer having a high Al composition provided by the aforementioned process in the second mirror 104 is oxidized from its side surface, thereby forming a current constricting layer 105 (see FIG. 7).

Then, an insulation layer 106 composed of polyimide resin is formed on the first mirror 102 by using a spin coat method. The insulation layer 106 is provided to cover the side wall 130b of the columnar section 130. Also, as shown in FIG. 7, an upper surface 106a of the insulation layer 106 and an upper surface 130a of the columnar section 130 are formed to have the same height.

(2) Electrode Forming Process

Next, a second electrode 109 is formed through applying the electrode forming method of an exemplary aspect of the invention (see FIG. 8 through FIG. 13). First, an adhesion preventing member 112 having a predetermined pattern is formed on the upper surface 130a (base member) of the columnar section 130. The adhesion preventing member 112 is provided over a region that becomes to be the emission surface 108 of the surface-emitting laser 100. Also, in the present exemplary embodiment, the adhesion preventing member 112 is composed of photoresist. The adhesion preventing member 112 is formed by using a suitable photolithography method. Specifically, in the present exemplary embodiment, the adhesion preventing member 112 is formed with positive type photoresist including novolac resin.

Figure 9:
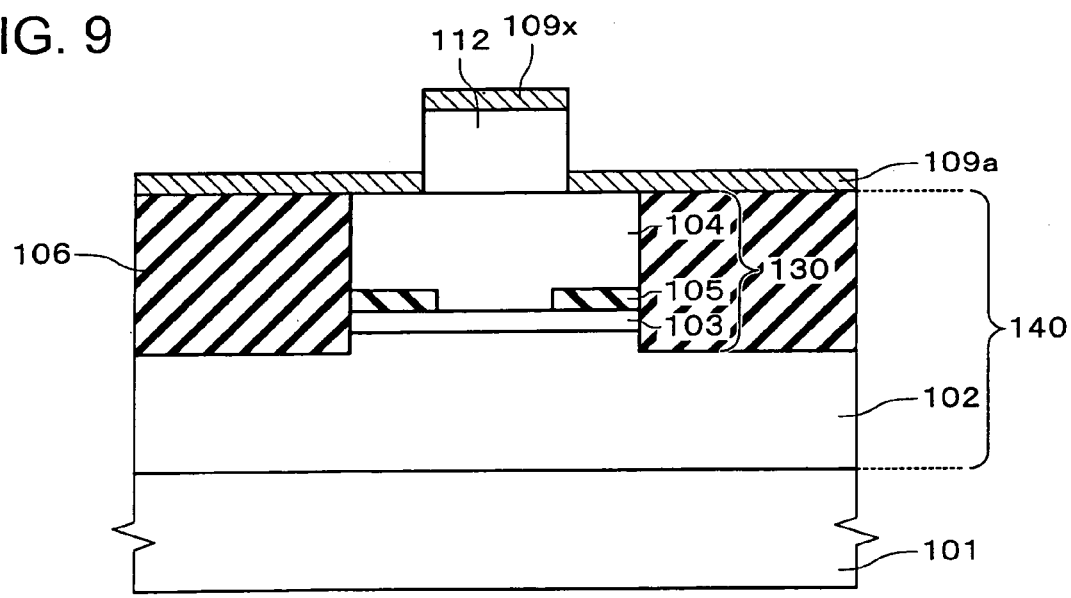
FIG. 9 is a schematic showing a step for manufacturing the surface-emitting type semiconductor laser shown in FIG. 3 and FIG. 4.
Figure 10:
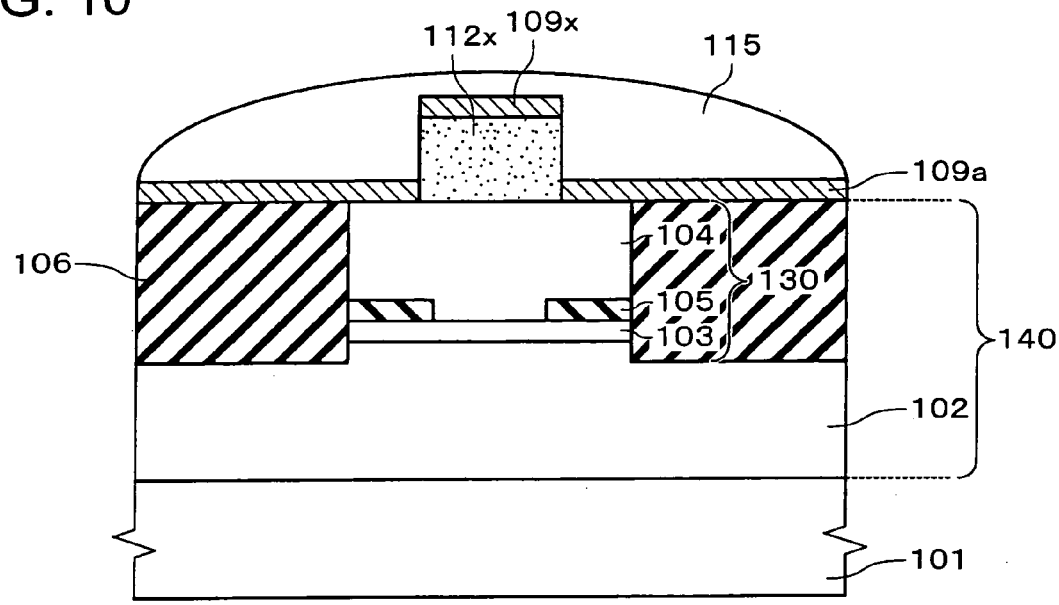
FIG. 10 is a schematic showing a step for manufacturing the surface-emitting type semiconductor laser shown in FIG. 3 and FIG. 4.

Then, a conductive layer 109a is formed on the adhesion preventing member 112 and the insulation layer 106 (see FIG. 9). The conductive layer 109a can be composed of a material enumerated as the material of the conductive layer 20a. Then, by soaking the adhesion preventing member 112 with a liquid 115, the adhesion preventing member 112 is degenerated whereby an adhesion preventing member 112x is obtained (see FIG. 10). The liquid 115 used is isopropyl alcohol, and the adhesion preventing member 112x is soaked with the liquid 115 for about 10 second. In this step, the adhesion preventing member 112 does not dissolve in the isopropyl alcohol because the adhesion preventing member 112 has a low solubility to isopropyl alcohol, and the adhesion preventing member 112 is swelled with the isopropyl alcohol. In the exemplary embodiment, the adhesion preventing member 112 is swelled with the isopropyl alcohol so that the adhesion preventing member 112 is changed in quality.

Figure 11:
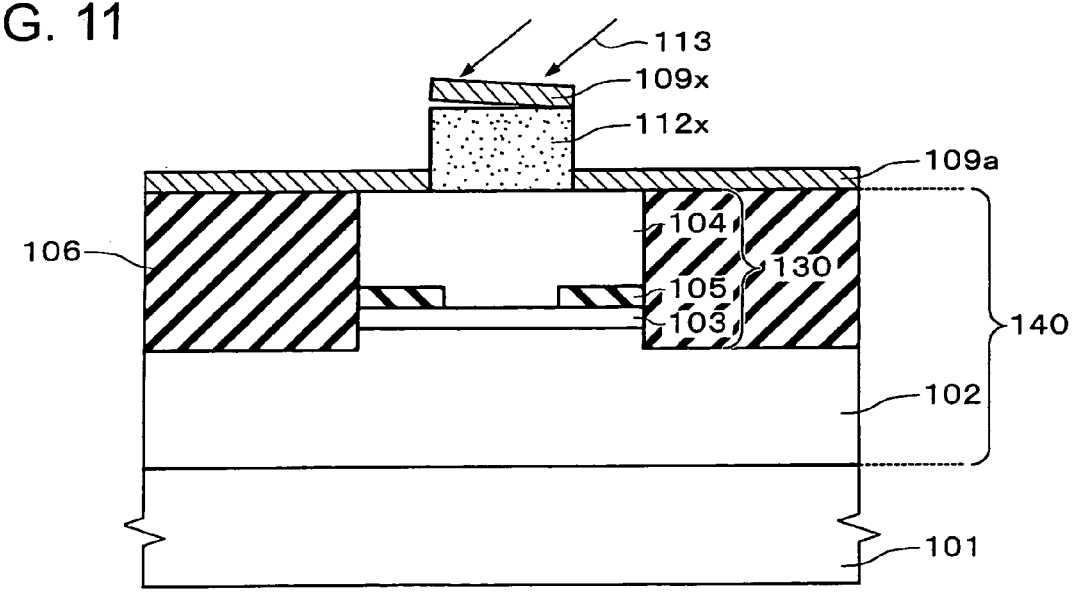
FIG. 11 is a schematic showing a step for manufacturing the surface-emitting type semiconductor laser shown in FIG. 3 and FIG. 4.

Then, the conductive layer 109a (conductive layer 109x) on the adhesion preventing member 112x is removed in the state in which the adhesion preventing member 112x is disposed on the upper surface 130a of the columnar section 130 (see FIG. 11). In the present exemplary embodiment, pure water 113 is used as the liquid. The conductive layer 109x is removed by jetting the pure water 113 to the conductive layer 109x under a pressure of 0.25 Mpa for 60 second (see FIG. 12). By this, the second electrode 109 is obtained (see FIG. 12). It is noted that, in the step described above, as the liquid or gas to remove the conductive layer 109x, compressed air, nitrogen gas or the like, for example, can be used instead of the pure water 113.

Figure 12:
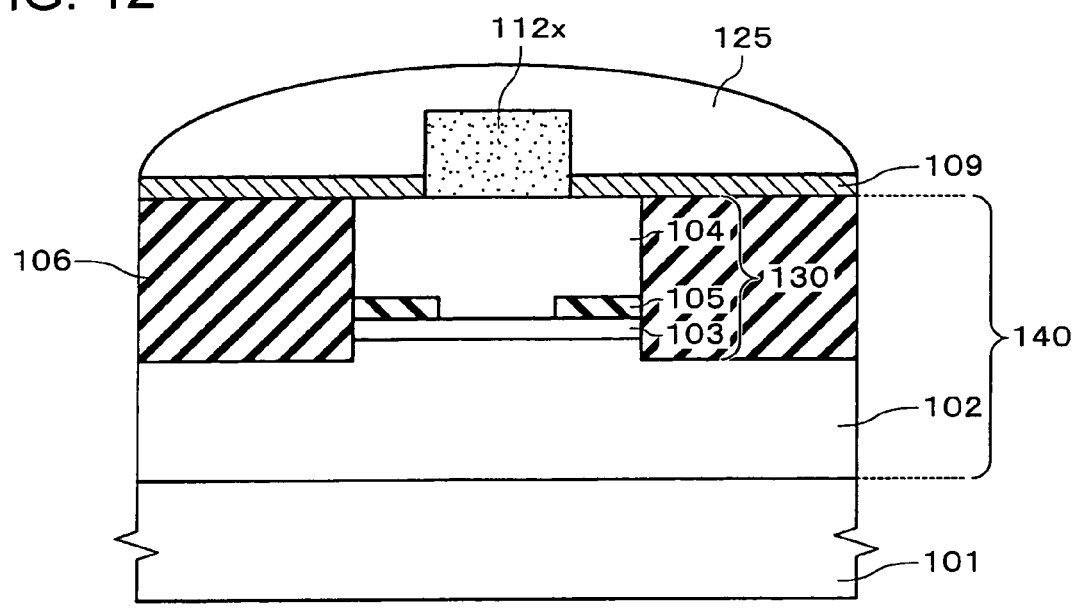
FIG. 12 is a schematic showing a step for manufacturing the surface-emitting type semiconductor laser shown in FIG. 3 and FIG. 4.

Then, the adhesion preventing member 112x is soaked with resist thinner 125 (see FIG. 12). By this, the adhesion preventing member 112x dissolves in the resist thinner 125, and the adhesion preventing member 112x is removed (see FIG. 13). As a result, an opening section 114 is formed in the region where the adhesion preventing member 112x was provided. By the steps described above, the second electrode 109 having the opening section 114 is obtained. Next, by forming a first electrode 107, the surface-emitting laser 100 is obtained (see FIG. 3 and FIG. 4).

COMPARISON EXAMPLE

A surface-emitting laser 900 (see FIG. 20) is formed as a comparison example. In the surface-emitting laser 900, an electrode (second electrode) 909 is formed by an ordinary electrode forming method. It is noted that the surface-emitting laser 900 of the comparison example is manufactured by the same manufacturing process as the process used for manufacturing the surface-emitting laser 100 of the exemplary embodiment, except that the method of forming the second electrode 909 is different from the method used to form the second electrode 109 of the surface-emitting laser 101 of the exemplary embodiment.

Figure 21:
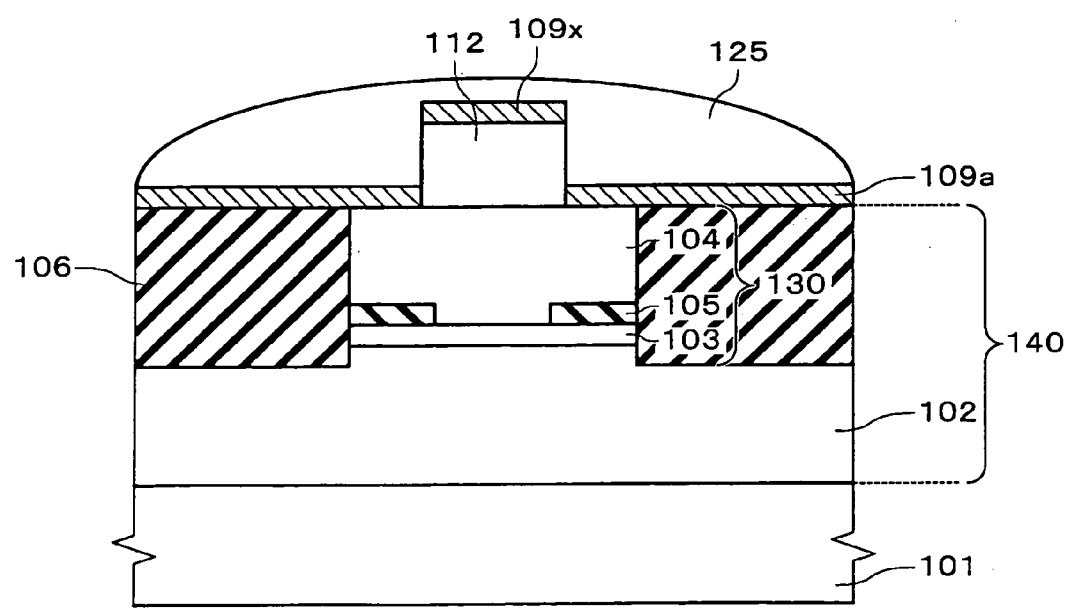
FIG. 21 is a schematic showing a step for manufacturing the surface-emitting type semiconductor laser of the comparison example shown in FIG. 20.
Figure 22:
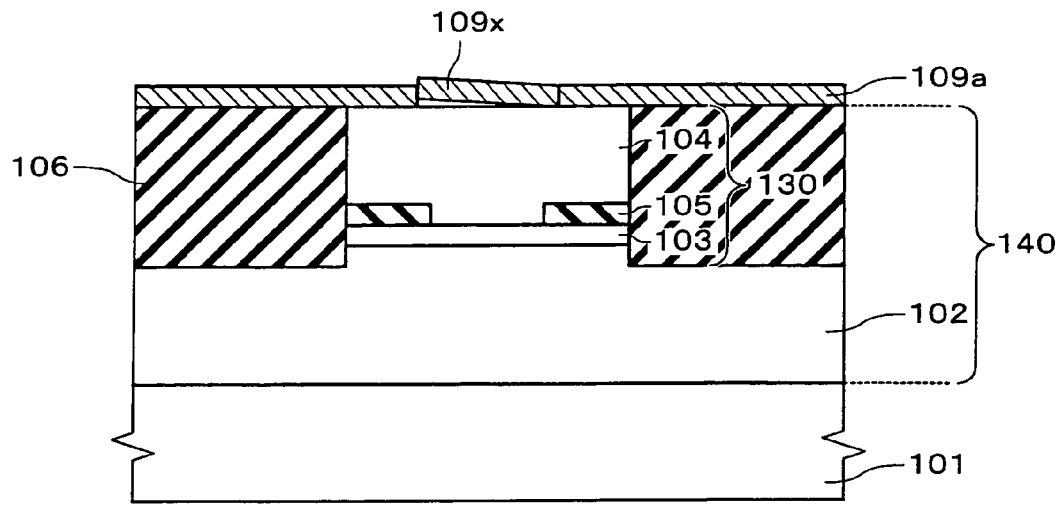
FIG. 22 is a schematic showing a step for manufacturing the surface-emitting type semiconductor laser of the comparison example shown in FIG. 20.

Specifically, after a device portion is formed by the same process used for the surface-emitting laser 100 of the exemplary embodiment, an adhesion preventing member 112 is formed. Then a conductive layer 109a is formed on the adhesion preventing member 112 and the insulation layer 106 (see FIG. 5-FIG. 9). Then, the adhesion preventing member 112 is soaked with resist thinner 125 (see FIG. 21). By this, the adhesion preventing member 112 is dissolved in the resist thinner 125, and the adhesion preventing member 112 is removed. Here, the removal of the adhesion preventing member 112 causes a conductive layer 109x to adhere to an upper surface 130a of the conductive layer 130 (see FIG. 22). Next, the conductive layer 109x adhered to the upper surface 130a of the columnar section 130 is removed by discharging pure water 113 under a high pressure against the conductive layer 109x (see FIG. 23). By this, a second electrode 909 having an opening section 114 is obtained (see FIG. 20). Next, a first electrode 107 is formed by the same method as the one used for the surface-emitting laser 100 of the exemplary embodiment, whereby the surface-emitting laser 900 of the comparison example is obtained (see FIG. 20).

Measurement Result of Luminous Efficiency

The surface-emitting laser 900 that is obtained according to the exemplary embodiment and the surface-emitting laser 100 that is obtained according to the comparison example were formed into laser arrays. Each of the laser arrays was formed from about 7900 surface-emitting laser elements. Luminous efficiency of each of the surface-emitting lasers of these laser arrays was measured. Luminous efficiency is represented by [W/A], which is a rate of a laser light output generated per a predetermined electric current that is applied to the surface-emitting laser. Those among the entire elements whose luminous efficiency is in a range of 0.4-0.6 [W/A] except those that exist within 5 mm from the outer circumference of the wafer were judged to be non-defective. Those that exist outside this range were judged to be defective, and the defective incidence rate [%] was calculated.

As a result, the surface-emitting lasers 900 of the comparison example resulted in a defective incidence rate of 17%, and a variation of luminous efficiency (standard deviation) of 0.125 W/A. In contrast, the surface-emitting lasers 100 of the exemplary embodiment resulted in a defective incidence rate of 3% and a variation of luminous efficiency (standard deviation) of 0.053 W/A. Thus it was confirmed that the variation of luminous efficiency decreased greatly and the defective incidence rate decreased to about ⅓ in the surface-emitting lasers 100 of the exemplary embodiment, compared with the surface-emitting laser 900 of the comparison example. As a result, it was confirmed that devices with an excellent yield can be manufactured according to the electrode forming method of the present exemplary embodiment.

The following matters (1)-(3) are considered to be the reasons why such a result is obtained.

(1) The opening section 114 is provided in the upper surface 130a of the columnar section 130 of the surface-emitting laser 100 according to the electrode forming method of the exemplary embodiment. The bottom surface in the opening section 114 functions as the emission surface 108 of the surface-emitting laser 100. The state of this emission surface 108 has a substantial influence on the characteristic of the surface-emitting laser 100. According to the electrode forming method of the exemplary embodiment, the conductive layer 109x can be removed without exposing the upper surface 130a of the columnar section 130 including the emission surface 108 (see FIG. 11). Therefore, deposits (for example, metal particulates, etc.) that might have been generated when the conductive layer 109x is removed, would not adhere to the emission surface 108 when the conductive layer 109x is removed. As a result, the characteristic of the surface-emitting laser 100 can be maintained, and thus the yield is excellent.

Figure 20:
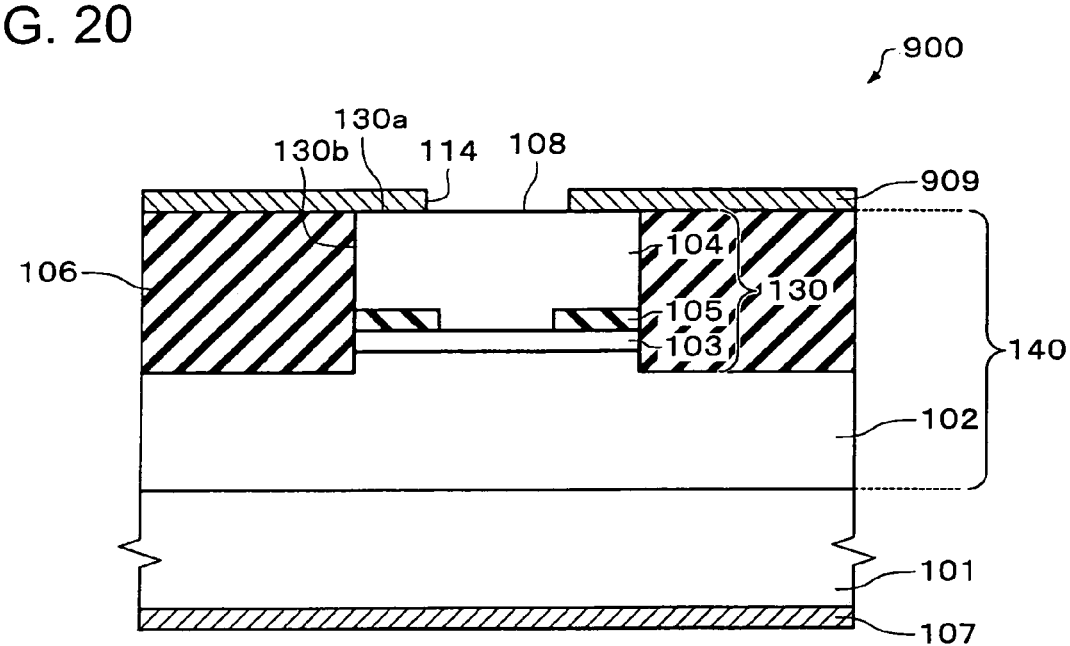
FIG. 20 is a schematic shows a cross-sectional view of a surface-emitting type semiconductor laser of a comparison example.

(2) The ordinary surface-emitting laser 900 includes many recesses and protrusions in its structure (see FIG. 20). The surface-emitting laser 100 of the present exemplary embodiment is the same in this respect (see FIG. 3 and FIG. 4). For this reason, the conductive layer 109x would not be readily peeled off when the adhesion between the conductive layer 109x and the adhesion preventing member 112 is strong. In particular, when an adhesive sheet (not shown in the figure) is used to peel off the conductive layer 109x, the device section is subjected to a physical load and damages may be caused in the device section when peeling off the conductive layer 109x.

Figure 13:
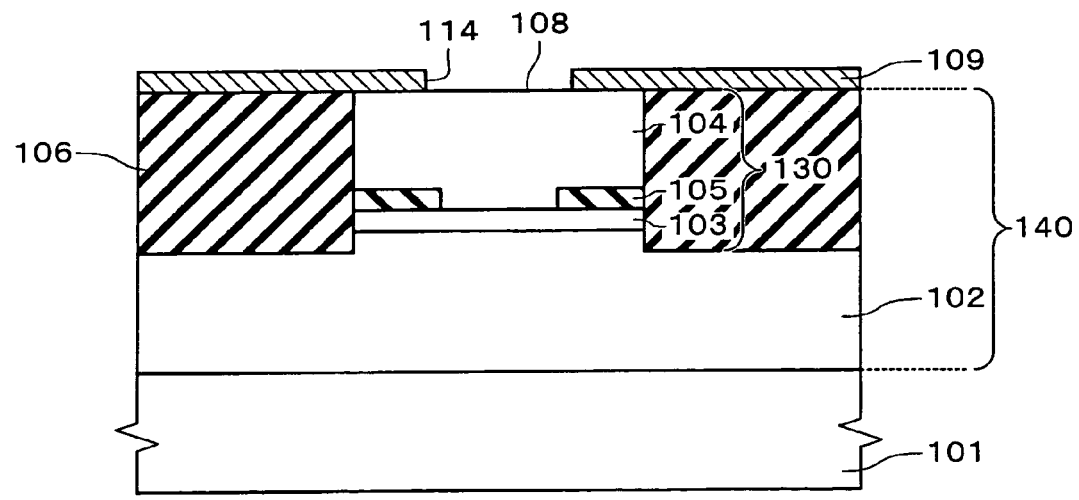
FIG. 13 is a schematic showing a step for manufacturing the surface-emitting type semiconductor laser shown in FIG. 3 and FIG. 4.

In contrast, according to the surface-emitting laser 100 of the exemplary embodiment, after the adhesion preventing member 112x, whose adhesion with the conductive layer 20x has been decreased, is formed by soaking the adhesion preventing member 112 with the liquid 115, the conductive layer 20x is removed (see FIG. 11-FIG. 13). By this, the adhesion of the conductive layer 20x with the adhesion preventing member 112x is decreased, and thus the conductive layer 20x can be readily removed. Accordingly, even when the conductive layer 20x is removed by using an adhesive sheet (not show in the figure), the conductive layer 20x can be readily removed.

Figure 23:
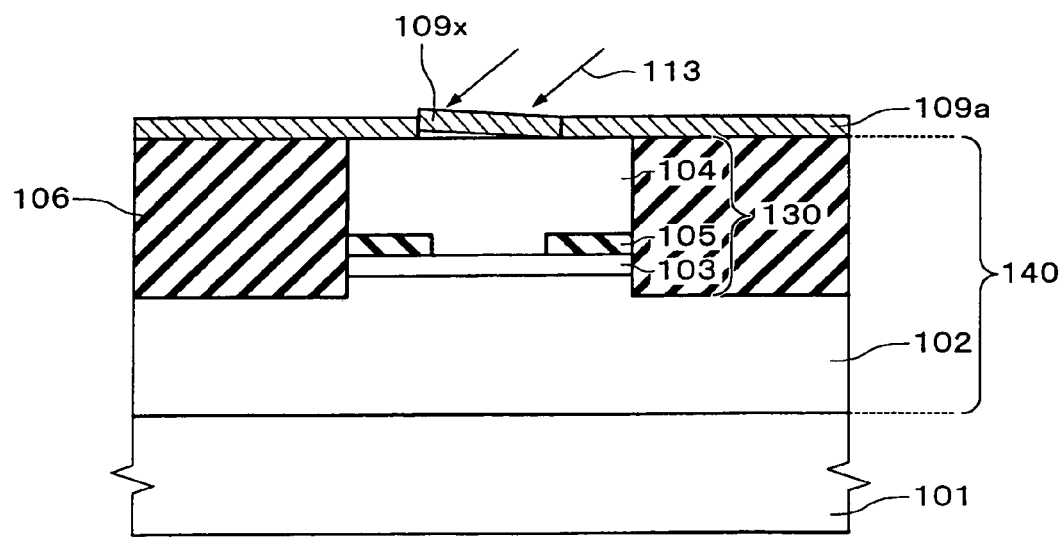
FIG. 23 is a schematic showing a step for manufacturing the surface-emitting type semiconductor laser of the comparison example shown in FIG. 20.

(3) In the ordinary surface-emitting laser 900, the top layer of the second mirror 104 includes a p-type $Al_{0.15}Ga_{0.85}As$ layer, just as does the surface-emitting laser 100 of the present exemplary embodiment. In general, the AlGaAs material has the characteristic that is somewhat etched with pure water. Therefore, some of the p-type $Al_{0.15}Ga_{0.85}As$ layer in the top layer is etched with pure water. For this reason, in the electrode forming process for the ordinary surface-emitting laser 900, when pure water 113 is discharged under a high pressure when the conductive layer 109x that adheres to the upper surface 130a of the columnar section 130 is removed as shown in FIG. 23, the top layer of the second mirror 104 is etched. The reflection condition of laser light changes when the film thickness of the top layer of the second mirror 104 changes. When variations occur in the amount of etching in the top layers of the second mirrors 104, variations occur in the film thickness of the second mirrors 104, which causes problems, such as changes of the amount of laser light emitted from the surface-emitting lasers 900. As a result, variations are caused in the luminous efficiency of the surface-emitting lasers 900.

In contrast, according to the surface-emitting laser 100 of the present exemplary embodiment, when the conductive layer 109x is removed, the pure water 113 is discharged to the conductive layer 109x. The pure water 113 is not discharged directly to the upper surface 130a of the columnar section 130. Consequently, the top layer of the second mirror 104 can be prevented from being etched. As a result, because variations in the amount of emission light of the surface-emitting lasers 100 can be reduced or prevented from occurring, variations in the luminous efficiency of the surface-emitting lasers 100 can be reduced.

Exemplary Embodiment 2

Figure 14:
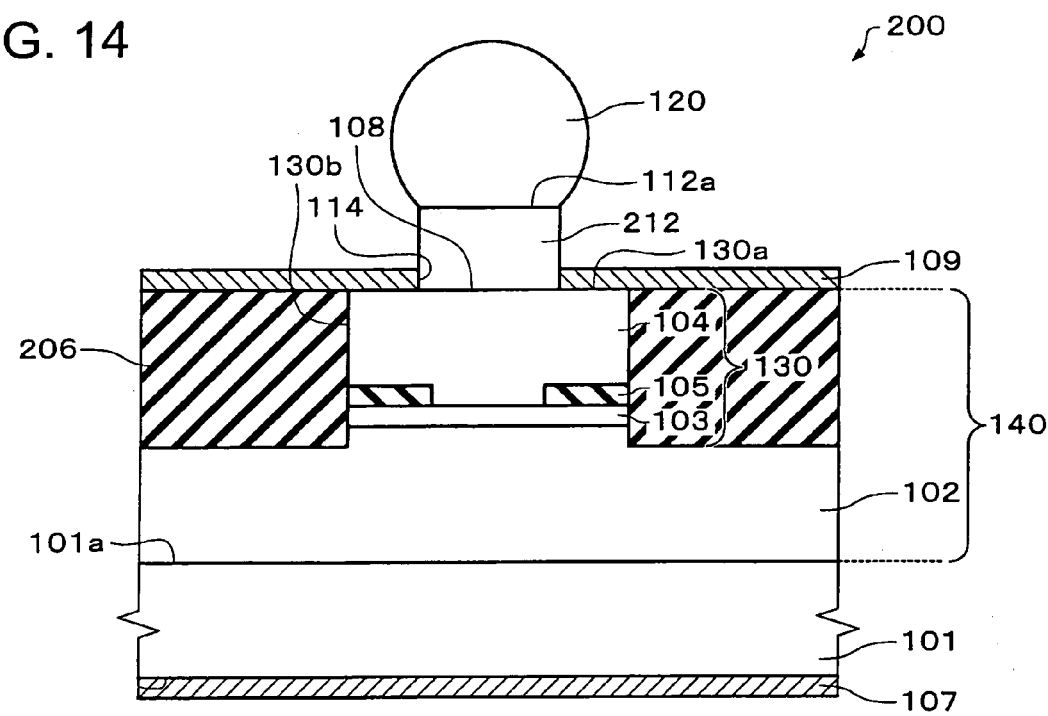
FIG. 14 is a schematic of a surface-emitting type semiconductor laser having an electrode obtained by using the electrode forming method in accordance with the second exemplary embodiment of the invention.
Figure 15:
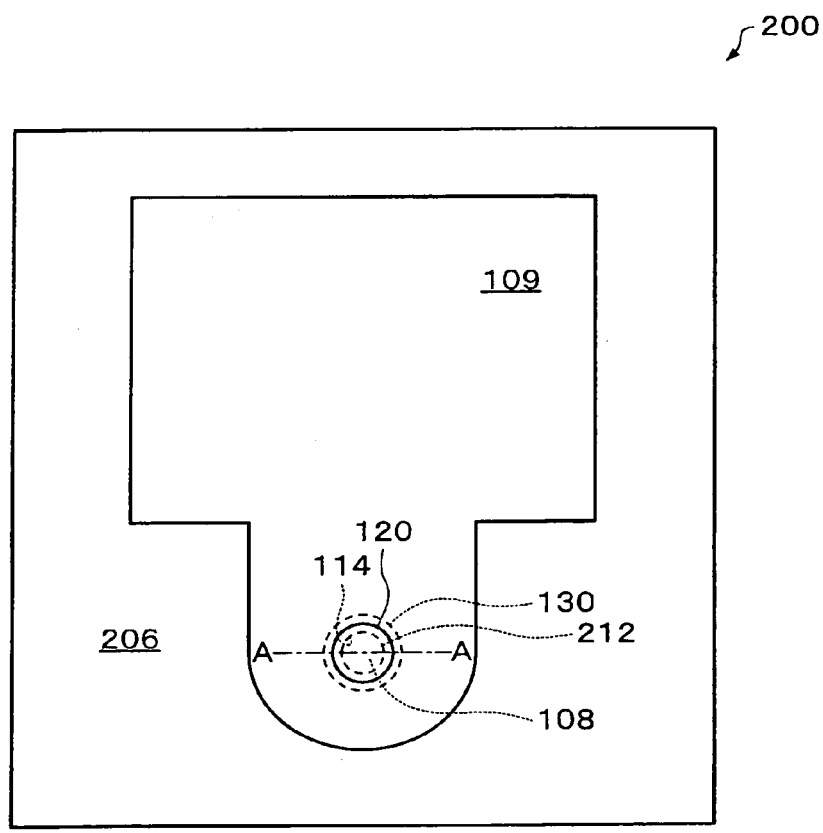
FIG. 15 is a schematic of the surface-emitting type semiconductor laser shown in FIG. 14.

FIG. 14 is a schematic of a surface-emitting laser 200 having an electrode (second electrode) 109 that is formed by using an electrode forming method of an exemplary aspect of the invention. Specifically, the surface-emitting laser 200 of the present exemplary embodiment is formed through the application of the electrode forming method of the first exemplary embodiment described above. FIG. 15 is a schematic of the surface-emitting laser 200 shown in FIG. 14. FIG. 14 is the cross-sectional schematic taken along a plane A-A in FIG. 15.

In the surface-emitting laser 200 of this exemplary embodiment, an adhesion preventing member 212 is not removed, and an optical member 120 is provided on an upper surface 212a of the adhesion preventing member 212. The optical member 120 can function as a lens. In this case, the adhesion preventing member 212 includes a material that can pass at least part of light emitted from the emission surface 108.

Figure 8:
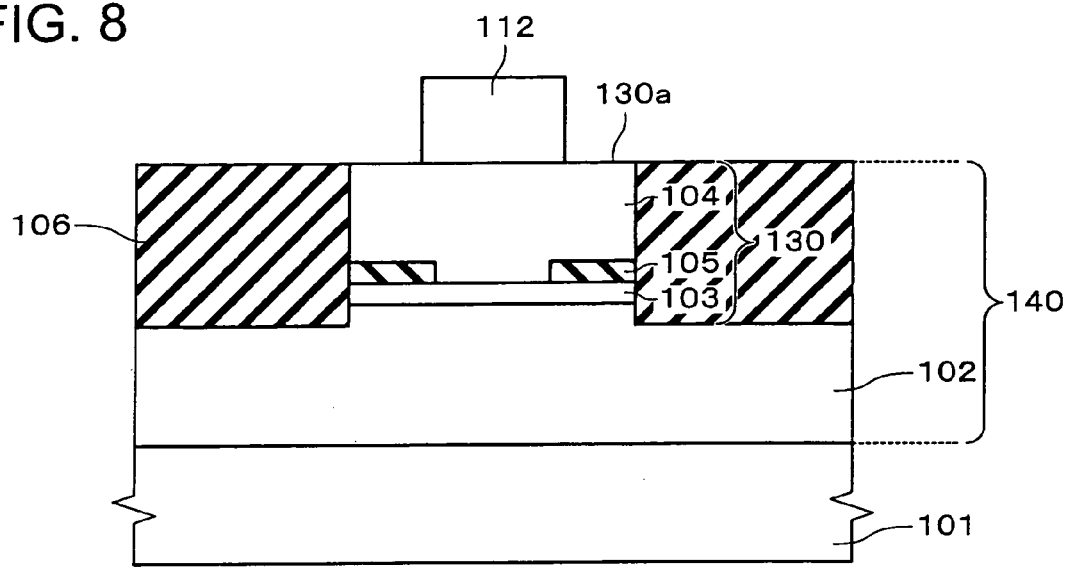
FIG. 8 is a schematic showing a step for manufacturing the surface-emitting type semiconductor laser shown in FIG. 3 and FIG. 4.

The surface-emitting laser 200 of the present exemplary embodiment can be formed by a method similar to the method used for the surface-emitting laser 100 of the exemplary embodiment 1 described above up to a certain point of the process. Specifically, after the element section is formed by the method shown in FIG. 5-FIG. 7, an adhesion preventing member 212 and a conductive layer 109a are formed as shown in FIG. 8 and FIG. 9. In this exemplary embodiment, a dielectric layer 206, with which a side wall 130b of a columnar section 130 is covered, is formed with silicon nitride, for example, and the adhesion preventing member 212 is formed with polyimide resin, for example.

Figure 16:
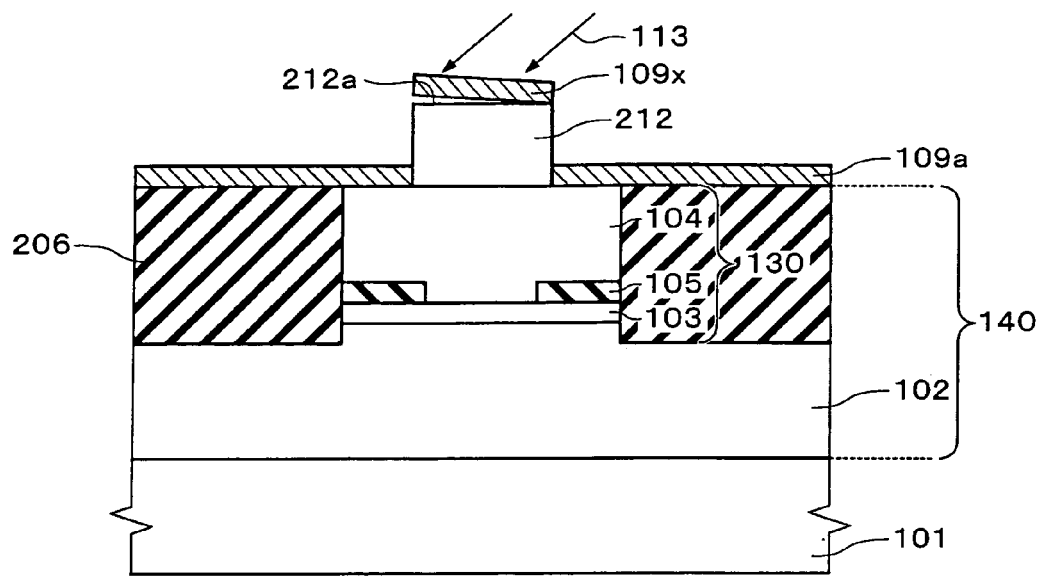
FIG. 16 is a schematic showing a step for manufacturing the surface-emitting type semiconductor laser shown in FIG. 14 and FIG. 15.
Figure 17:
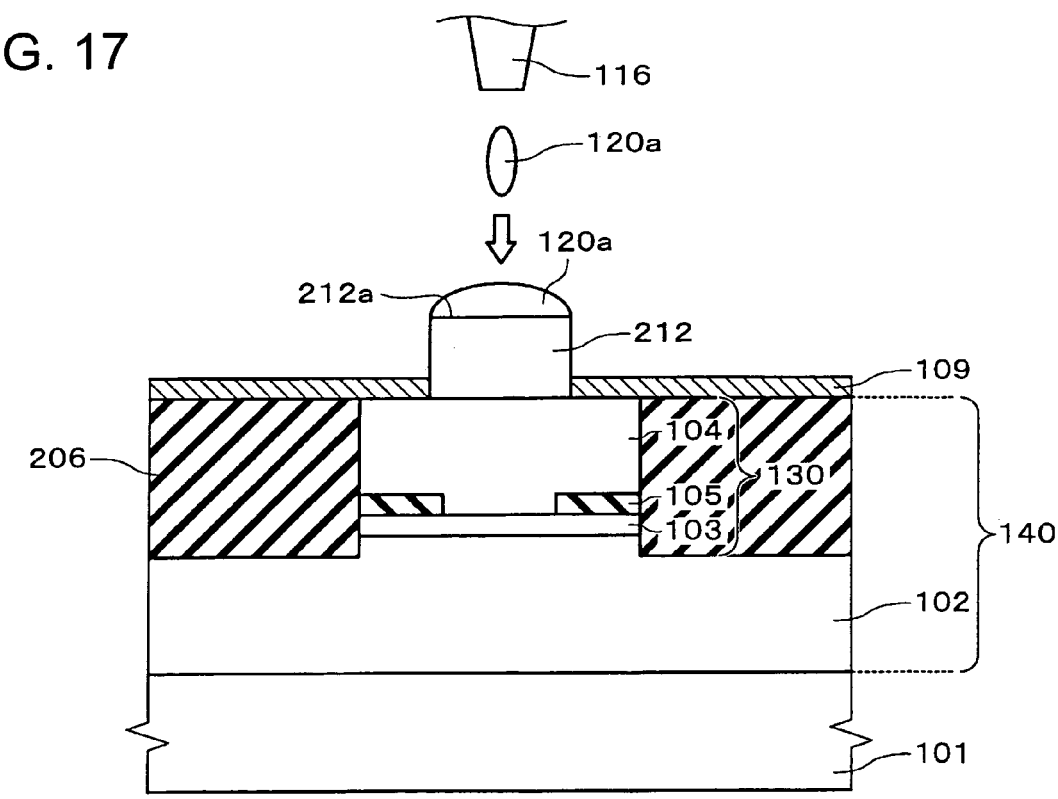
FIG. 17 is a schematic showing a step for manufacturing the surface-emitting type semiconductor laser shown in FIG. 14 and FIG. 15.
Figure 18:
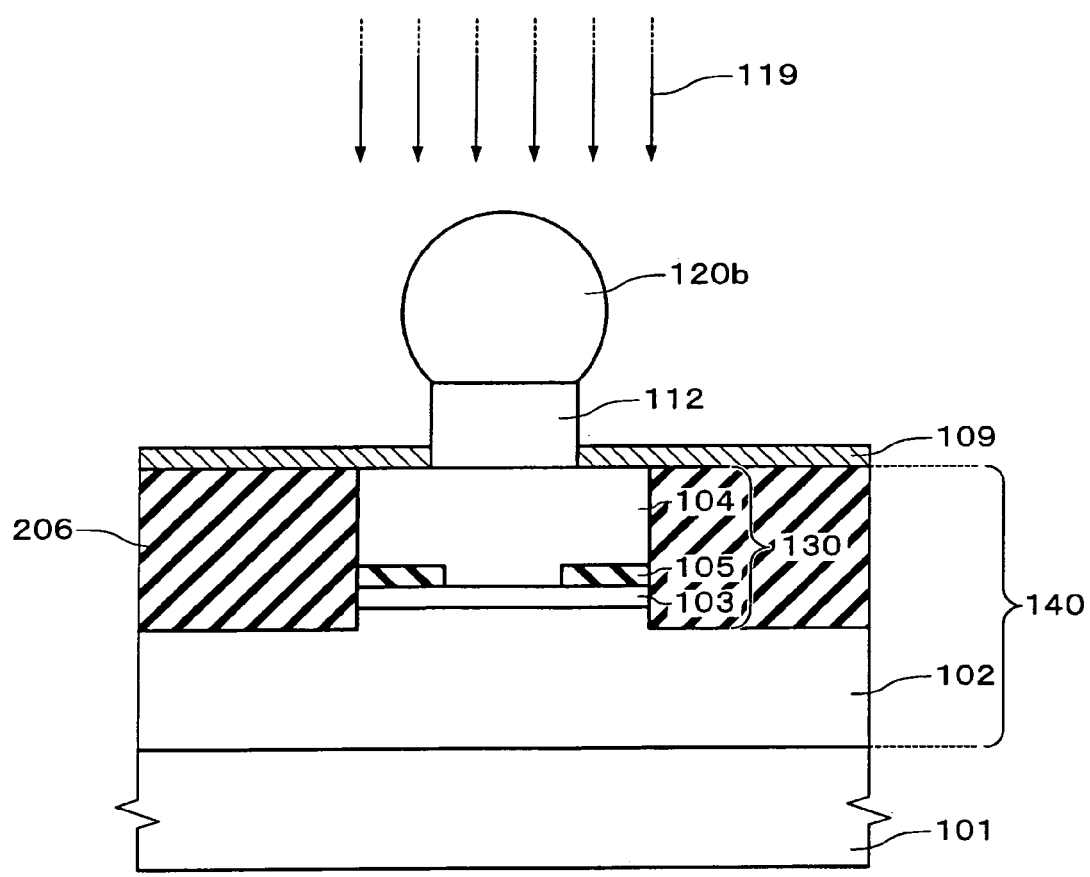
FIG. 18 is a schematic showing a step for manufacturing the surface-emitting type semiconductor laser shown in FIG. 14 and FIG. 15.
Figure 19A:
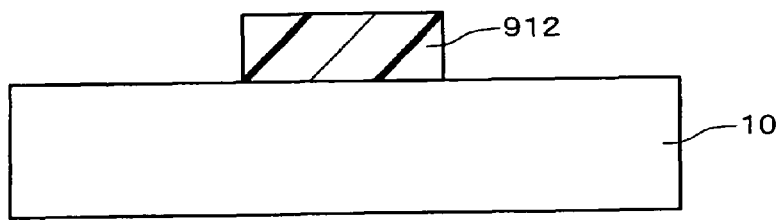
FIG. 19A through FIG. 19F are cross-sectional views schematically showing steps of a related art electrode forming method using a lift-off method.
Figure 19B:
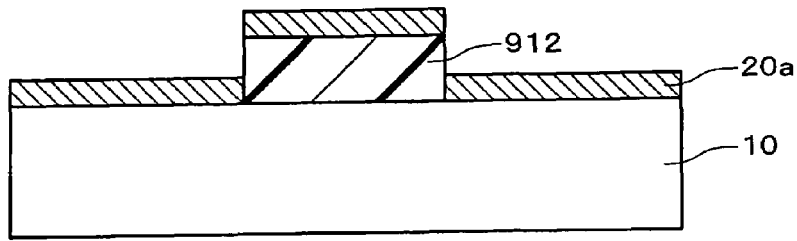
Figure 19C:
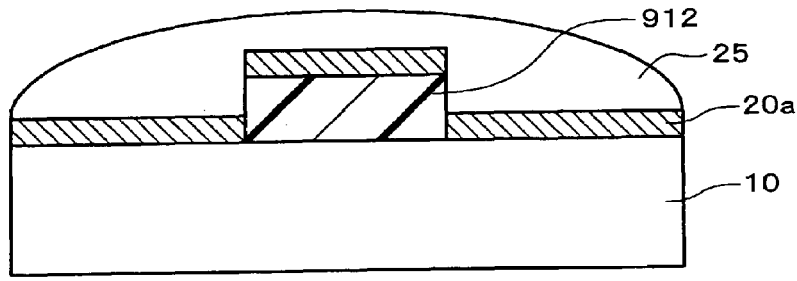
Figure 19D:
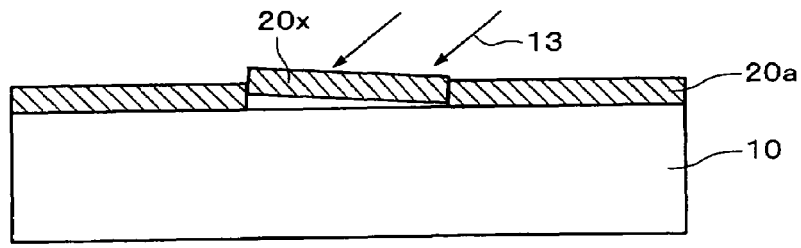
Figure 19E:
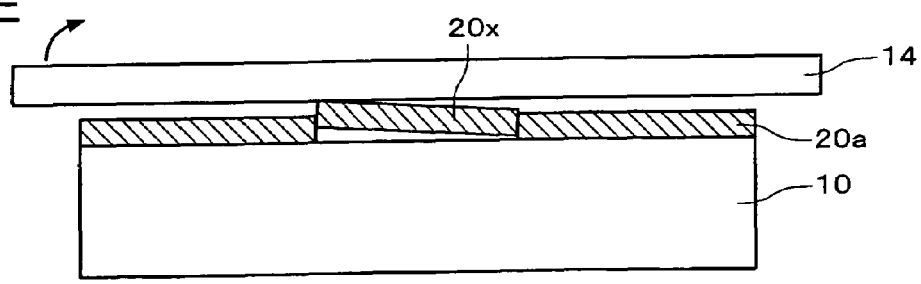
Figure 19F:
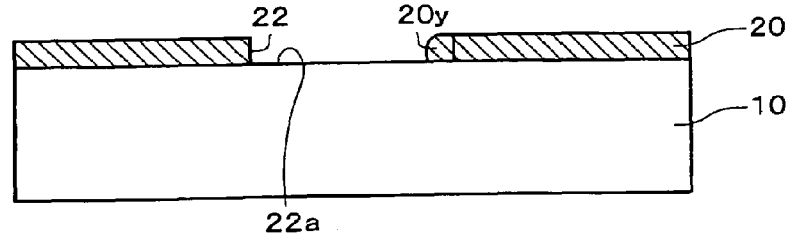

Next, an upper surface 212a of the adhesion preventing member 212 is degenerated depending on the requirements, to thereby decrease the adhesion between the adhesion preventing member 212 and a conductive layer 109a described below. Next, the conductive layer 109a (conductive layer 109x) on the adhesion preventing member 212 (see FIG. 16) is removed by discharging pure water 113 under a high pressure. Then, droplets 120a are discharged against an upper surface 212a of the adhesion preventing member 212. (see FIG. 17). The droplets 120a include material that sets by the application of energy, such as heat, light, etc., and may include UV settable type resin or thermosetting type resin, such as, for example, polyimide resin, epoxy resin, fluorine resin or acrylic resin. Also, the droplets 120a are discharged by, for example, an inkjet method. Specifically, an optical member precursor 120b is formed on an upper surface 212a of the adhesion preventing member 212 (see FIG. 18) through discharging the droplets 120a from an ink jet nozzle 116. Next, energy 119 is applied to the optical member precursor 120b to cause setting. The kind and radiation dose of the energy 119 are decided according to the material and the amount of the droplets 120a. As a result, the optical member 120 is formed (see FIG. 14 and FIG. 15).

According to the surface-emitting laser 200 of the present exemplary embodiment, after the adhesion between the adhesion preventing member 212 and the conductive layer 109a to be described below is decreased, a conductive layer 109x is formed on the upper surface 212a of the adhesion preventing member 212. As a result, the conductive layer 109x can be readily removed.

Also, according to the surface-emitting laser 200 of the present exemplary embodiment, the optical coupling efficiency can be adjusted due to the fact that the optical member 120 is provided over the emission surface 108 through the adhesion preventing member 212. Specifically, the optical coupling efficiency can be adjusted by adjusting the height of the adhesion preventing member 212. As described above, according to the surface-emitting laser 200 of the present exemplary embodiment, the adhesion preventing member 212 is not removed and can be used as a member to adjust the optical coupling efficiency.

The invention is not limited to the exemplary embodiments described above, and many modifications can be made. For example, the invention may include compositions that are substantially the same as the compositions described in the exemplary embodiments. For example, a composition with the same function, method and result, or a composition with the same objects and result. Also, the invention may include compositions in which portions not essential in the compositions described in the exemplary embodiments are replaced with others. Also, the invention may include compositions that can achieve the same functions and effects or achieve the same objects of those of the compositions described in the exemplary embodiments. Furthermore, the invention may include compositions that include related art technology added to the compositions described in the exemplary embodiments.

For example, in the surface-emitting type semiconductor lasers of the exemplary embodiments described above, the case where a resonator is provided with a single columnar section is described. However, the exemplary embodiments of the invention would not be harmed if a plurality of columnar sections are provided in a resonator. Also, similar actions and effects are obtained even when a plurality of surface-emitting type semiconductor lasers are provided in an array.

Also, it should be noted that, for example, interchanging the p-type and n-type characteristics of each of the semiconductor layers in the above described exemplary embodiments does not deviate from the subject matter of the invention. In the above described exemplary embodiments, the description is made as to an AlGaAs type, but depending on the oscillation wavelength to be generated, other materials, such as, for example, GaInP type, ZnSSe type, InGaN type, AlGaN type, InGaAs type, GaInNAs type, GaAsSb type, and like semiconductor materials can be used. It is noted that a surface-emitting type semiconductor laser of an exemplary aspect of the invention may be formed by using a semiconductor material, such as GaAsSb type, InGaAs type, and GaInN As type.

What is claimed is:

1. An electrode forming method, comprising:
   (a) forming an adhesion preventing member having a predetermined pattern on a base member;
   (b) forming a conductive layer on the base member and the adhesion preventing member;
   (c) degenerating at least a surface of the adhesion preventing member to thereby lower adhesion thereof with the conductive layer;
   (d) forming an electrode having a predetermined pattern by removing the conductive layer on the adhesion preventing member in a state in which the adhesion preventing member having at least the surface thereof degenerated is disposed on the base member; and
   (e) removing the adhesion preventing member after (d) by using an etchant having an etching rate to the base member greater than an etching rate to the adhesion preventing member.

2. The electrode forming method according to claim 1, further including degenerating at least the surface of the adhesion preventing member by conducting a plasma processing on the surface of the adhesion preventing member.

3. The electrode forming method according to claim 1, (c) further including degenerating the adhesion preventing member by soaking the adhesion preventing member with a liquid.

4. The electrode forming method according to claim 3, (c) further including degeneration of the adhesion preventing member by swelling of the adhesion preventing member by the liquid.

5. The electrode forming method according to claim 3, the adhesion preventing member being a photoresist.

6. An electrode forming method, comprising:
   (a) forming an adhesion preventing member having a predetermined pattern on a base member;
   (b) forming a conductive layer on the base member and the adhesion preventing member;
   (c) forming an electrode having a predetermined pattern by removing the conductive layer on the adhesion preventing member in a state in which the adhesion preventing member is disposed on the base, member, and
   (d) removing the adhesion preventing member after (c) by using an etchant having an etching rate to the base member greater than an etching rate to the adhesion preventing member,
   adhesion between the adhesion preventing member and the conductive layer being smaller than adhesion between the base member and the conductive layer.

7. The electrode forming method according to claim 1, the electrode being an electrode of an optical device.

8. The electrode forming method according to claim 7, the optical device being one of a surface-emitting type semiconductor laser, a photodiode and a semiconductor light-emitting diode.

9. The electrode forming method according to claim 1, the adhesion preventing member being an insulation material.

10. The electrode forming method according to claim 9, the insulation material being at least one material selected from silicon oxides and silicon nitrides.

11. The electrode forming method according to claim 9, the insulation material being resin.

12. The electrode forming method according to claim 11, the resin being at least one resin selected from polyimide resin, fluororesin, acrylic resin, and epoxy resin.

* * * * *